US012568846B2

(12) United States Patent
Farooq et al.

(10) Patent No.: US 12,568,846 B2
(45) Date of Patent: Mar. 3, 2026

(54) WAFER DIES WITH THERMALLY CONDUCTING PERIMETER REGIONS

(71) Applicant: International Business Machines Corporation, Armonk, NY (US)

(72) Inventors: Mukta Ghate Farooq, Hopewell Junction, NY (US); Keiji Matsumoto, Yokohama (JP); John Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 18/080,034

(22) Filed: Dec. 13, 2022

(65) Prior Publication Data

US 2024/0194555 A1 Jun. 13, 2024

(51) Int. Cl.
| | |
|---|---|
| *H01L 23/31* | (2006.01) |
| *H01L 23/29* | (2006.01) |
| *H01L 23/48* | (2006.01) |
| *H01L 23/00* | (2006.01) |
| *H01L 23/528* | (2006.01) |

(52) U.S. Cl.
CPC .......... *H01L 23/3192* (2013.01); *H01L 23/29* (2013.01); *H01L 23/291* (2013.01); *H01L 23/3185* (2013.01); *H01L 23/481* (2013.01); *H01L 23/528* (2013.01); *H01L 24/16* (2013.01); *H01L 2224/16225* (2013.01)

(58) Field of Classification Search
CPC ... H01L 23/3192; H01L 23/29; H01L 23/291; H01L 23/3185
See application file for complete search history.

(56) References Cited

U.S. PATENT DOCUMENTS

| | | | |
|---|---|---|---|
| 5,727,727 A | 3/1998 | Ead | |
| 6,122,171 A | 9/2000 | Akram | |
| 6,278,184 B1 | 8/2001 | Brofman | |
| 6,631,078 B2 | 10/2003 | Alcoe | |
| 8,048,794 B2 * | 11/2011 | Knickerbocker | ........................... H01L 21/76898 438/18 |
| 8,759,949 B2 | 6/2014 | Yu et al. | |

(Continued)

FOREIGN PATENT DOCUMENTS

| | | | | |
|---|---|---|---|---|
| CN | 107768370 B | * | 10/2021 | ......... H01L 25/0652 |
| CN | 114664812 A | * | 6/2022 | ............. H02H 9/046 |

(Continued)

OTHER PUBLICATIONS

Jaromir Bilek et al., "Thermal conductivity of molten lead-free solders." International Journal of Thermophysics, vol. 27, No. 1, 2006, pp. 92-102.

(Continued)

*Primary Examiner* — Laura M Menz
(74) *Attorney, Agent, or Firm* — Jeffrey Kelly; Ryan, Mason & Lewis, LLP

(57) ABSTRACT

A semiconductor structure includes a first back-end-of-line region coupled to a first side of a front-end-of-line region, a second back-end-of-line region coupled to a second side of the front-end-of-line region, and a thermally conducting region at least partially surrounding a perimeter of the front-end-of-line region, the first back-end-of-line region and the second back-end-of-line region.

18 Claims, 8 Drawing Sheets

(56) References Cited

U.S. PATENT DOCUMENTS

| | | | | |
|---|---|---|---|---|
| 8,999,764 | B2 * | 4/2015 | Farooq | H01L 23/5329 |
| | | | | 438/126 |
| 9,559,040 | B2 * | 1/2017 | Batra | H01L 25/0657 |
| 10,068,899 | B2 * | 9/2018 | Melville | H10D 88/101 |
| 10,204,829 | B1 * | 2/2019 | Amanapu | H01L 21/76831 |
| 10,269,676 | B2 | 4/2019 | Chiang | |
| 10,332,818 | B2 | 6/2019 | Morianz et al. | |
| 10,529,622 | B1 * | 1/2020 | Maniscalco | H01L 21/76858 |
| 10,636,739 | B2 * | 4/2020 | Beyne | H10D 84/856 |
| 10,784,200 | B2 * | 9/2020 | Farooq | H01L 23/5329 |
| 11,658,116 | B2 * | 5/2023 | Wang | H10D 84/038 |
| | | | | 257/369 |
| 11,862,626 | B2 * | 1/2024 | Yeh | H02H 9/046 |
| 12,327,776 | B1 * | 6/2025 | Toh | H01L 23/5226 |
| 2009/0039515 | A1 * | 2/2009 | Farooq | H01L 23/5329 |
| | | | | 257/761 |
| 2009/0115026 | A1 | 5/2009 | Gerber et al. | |
| 2009/0243098 | A1 * | 10/2009 | Farooq | H01L 24/03 |
| | | | | 257/E21.477 |
| 2010/0264551 | A1 * | 10/2010 | Farooq | H01L 21/76898 |
| | | | | 438/109 |
| 2011/0042820 | A1 * | 2/2011 | Knickerbocker | |
| | | | | H01L 21/76898 |
| | | | | 257/E21.589 |
| 2011/0180925 | A1 * | 7/2011 | Chandrasekaran | H01L 23/367 |
| | | | | 257/713 |
| 2011/0186990 | A1 | 8/2011 | Mawatari et al. | |
| 2012/0161300 | A1 * | 6/2012 | Farooq | H01L 23/556 |
| | | | | 257/E23.114 |
| 2012/0326309 | A1 * | 12/2012 | Andry | H01L 23/481 |
| | | | | 257/E21.159 |
| 2013/0026606 | A1 * | 1/2013 | Farooq | H01L 25/0657 |
| | | | | 257/E21.705 |
| 2013/0260556 | A1 * | 10/2013 | Farooq | H01L 24/05 |
| | | | | 257/E21.174 |
| 2016/0099201 | A1 * | 4/2016 | Choi | H01L 24/13 |
| | | | | 257/621 |
| 2017/0249813 | A1 * | 8/2017 | Busby | G08B 13/128 |
| 2017/0324015 | A1 * | 11/2017 | Mandal | H10N 10/82 |
| 2018/0053743 | A1 * | 2/2018 | Melville | H01L 21/76877 |
| 2019/0123103 | A1 * | 4/2019 | Wu | H10N 70/8413 |
| 2019/0393130 | A1 * | 12/2019 | Mahnkopf | H01L 23/367 |
| 2020/0135514 | A1 * | 4/2020 | Tseng | G06F 30/39 |
| 2020/0234978 | A1 * | 7/2020 | Costa | H01L 21/6835 |
| 2020/0365593 | A1 * | 11/2020 | Chen | H01L 24/17 |
| 2021/0134760 | A1 * | 5/2021 | Gaide | H01L 21/78 |
| 2021/0167031 | A1 * | 6/2021 | Costa | H01L 23/3737 |
| 2022/0068886 | A1 * | 3/2022 | Chung | H01L 25/105 |
| 2022/0157657 | A1 * | 5/2022 | Cabral, Jr. | H01L 21/3065 |
| 2022/0181237 | A1 | 6/2022 | Yen et al. | |
| 2022/0238487 | A1 * | 7/2022 | Shih | H01L 25/50 |
| 2022/0262791 | A1 | 8/2022 | Shi et al. | |
| 2022/0270985 | A1 | 8/2022 | Ananiev et al. | |
| 2022/0278078 | A1 * | 9/2022 | Shih | H01L 25/50 |
| 2022/0285259 | A1 * | 9/2022 | Wang | H01L 23/481 |
| 2022/0285338 | A1 * | 9/2022 | Yeh | H02H 9/046 |
| 2023/0066183 | A1 * | 3/2023 | Sano | H01L 21/76251 |
| 2023/0215793 | A1 * | 7/2023 | Lee | H01L 24/16 |
| | | | | 257/690 |
| 2023/0230901 | A1 * | 7/2023 | Farooq | H01L 23/481 |
| | | | | 257/774 |
| 2024/0088135 | A1 * | 3/2024 | Yeh | H10D 89/811 |
| 2024/0145344 | A1 * | 5/2024 | Hsiao | H01L 21/76898 |
| 2024/0153894 | A1 * | 5/2024 | Knickerbocker | H01L 24/80 |
| 2024/0194555 | A1 * | 6/2024 | Farooq | H01L 23/291 |
| 2024/0282658 | A1 * | 8/2024 | Knickerbocker | H01L 23/3185 |
| 2024/0290688 | A1 * | 8/2024 | Kang | H01L 21/76841 |
| 2024/0355803 | A1 * | 10/2024 | Hung | H01L 24/16 |
| 2024/0387366 | A1 * | 11/2024 | Lin | H01L 21/76877 |
| 2024/0413034 | A1 * | 12/2024 | Lai | H10B 80/00 |
| 2024/0421077 | A1 * | 12/2024 | Chang | H01L 24/08 |
| 2025/0112116 | A1 * | 4/2025 | Lu | H01L 23/367 |
| 2025/0118625 | A1 * | 4/2025 | Lu | H01L 23/3677 |
| 2025/0118716 | A1 * | 4/2025 | Chen | H10B 80/00 |
| 2025/0140607 | A1 * | 5/2025 | Chen | H01L 21/76834 |
| 2025/0140633 | A1 * | 5/2025 | Lu | H01L 23/3732 |
| 2025/0149345 | A1 * | 5/2025 | Vaziri | H01L 23/3736 |
| 2025/0157898 | A1 * | 5/2025 | Santamaria | H01L 23/3107 |
| 2025/0192103 | A1 * | 6/2025 | Vaziri | H01L 25/18 |
| 2025/0210464 | A1 * | 6/2025 | Reber | H10D 1/60 |
| 2025/0226277 | A1 * | 7/2025 | Vaziri | H01L 23/481 |

FOREIGN PATENT DOCUMENTS

| | | | | | |
|---|---|---|---|---|---|
| CN | 114823657 | A | * | 7/2022 | H01L 23/5228 |
| CN | 117525026 | A | * | 2/2024 | H01L 23/528 |
| CN | 120201767 | A | * | 6/2025 | H01L 23/5226 |
| EP | 3324436 | A1 | * | 5/2018 | H01L 21/76895 |
| EP | 4576186 | A1 | * | 6/2025 | H01L 23/5226 |
| ID | P202405353 | A | * | 7/2024 | |
| TW | 202236587 | A | * | 9/2022 | H10D 89/911 |
| TW | 202416484 | A | * | 4/2024 | H01L 24/08 |
| WO | WO-2023131505 | A1 | * | 7/2023 | H01L 23/5226 |
| WO | WO-2024129760 | A1 | * | 6/2024 | H10N 79/00 |
| WO | WO-2024132433 | A1 | * | 6/2024 | C10G 1/10 |

OTHER PUBLICATIONS

List of IBM Patents or Patent Applications Treated as Related, Feb. 21, 2023, 2 pgs.

P. Gelsinger, "Intel Accelerated," Presentation, https://download.intel.com/newsroom/2021/client-computing/Intel-Accelerated-2021-presentation.pdf, Jul. 2021, 52 pages.

* cited by examiner

| Thermally Conducting Region Perimeter Width (μm) | Maximum Chip Temperature (°C) |
|---|---|
| 0 | 85 |
| 100 | 84.86 |
| 200 | 84.74 |
| 500 | 84.43 |
| 1000 | 84.05 |

700

| Number of Thermally Conducting Via Features | Maximum Chip Temperature (°C) |
|---|---|
| 0 | 84.050 |
| 1 | 84.050 |
| 2 | 84.049 |
| 5 | 84.048 |
| 10 | 84.045 |
| 20 | 84.041 |
| 50 | 84.027 |
| 100 | 84.005 |
| 200 | 83.960 |
| 400 | 83.869 |

INTEGRATED CIRCUIT
800

WAFER STRUCTURE(S) WITH
THERMALLY CONDUCTING
PERIMETER REGIONS
810

WAFER DIES WITH THERMALLY CONDUCTING PERIMETER REGIONS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming wafer dies with thermally conducting perimeter regions.

In one embodiment, a semiconductor structure includes a front-end-of-line region, a first back-end-of-line region coupled to a first side of the front-end-of-line region, a second back-end-of-line region coupled to a second side of the front-end-of-line region, and a thermally conducting region at least partially surrounding a perimeter of the front-end-of-line region, the first back-end-of-line region and the second back-end-of-line region.

In another embodiment, a semiconductor structure includes a wafer die including one or more active devices in a front-end-of-line region and a back-end-of-line region coupled to one side of the front-end-of-line region, and a thermally conducting region at least partially surrounding a perimeter of the wafer die.

In another embodiment, an integrated circuit includes a wafer die structure and a thermally conducting region at least partially surrounding a perimeter of the wafer die structure. The wafer die structure includes one or more active devices in a front-end-of-line region, a first back-end-of-line region coupled to a first side of the front-end-of-line region, a second back-end-of-line region coupled to a second side of the front-end-of-line region.

These and other features and advantages of embodiments described herein will become more apparent from the accompanying drawings and the following detailed description.

DETAILED DESCRIPTION

Figure 1A:
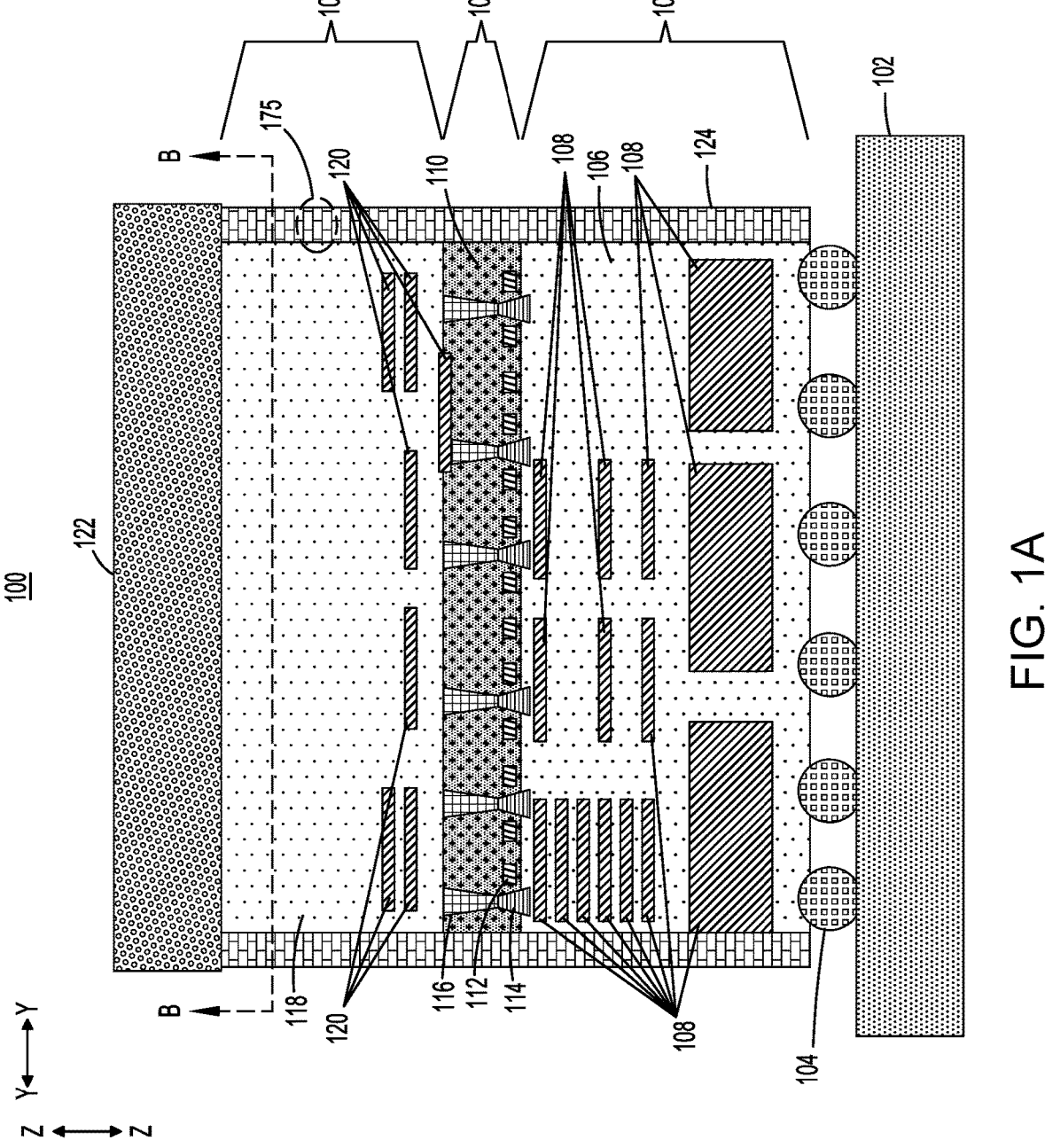
FIGS. 1A-1C show views of a structure with a perimeter of thermally conducting material surrounding a die, according to an embodiment of the invention.

Illustrative embodiments of the invention may be described herein in the context of illustrative methods for forming wafer dies with thermally conducting perimeter regions, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

With continuous scaling, more and more devices (e.g., transistors) are packed into integrated circuit chips (e.g., into one or more 100 millimeter $(mm)^2$ chips). To provide desired functionality, the devices must be interconnected through wiring and routing. With an increased number of devices in an integrated circuit, more and more wiring and routing resources are required to precisely connect the integrated circuit as desired for a particular use case. Thus, for example, more and more metal layers may be needed to connect all of the devices in an integrated circuit.

In a conventional approach an integrated circuit may include front-end-of-line (FEOL) processing for fabricating devices (e.g., transistors, capacitors, resistors, etc.) on a wafer and BEOL processing for interconnecting such devices on the wafer. More particularly, BEOL processes are typically focused on forming metal interconnects between the different devices of an integrated circuit, whereas the fabrication of the different devices that make up the integrated circuit is typically done during FEOL processing.

In FEOL processing, devices such as complementary metal-oxide-semiconductor (CMOS) field-effect transistors (FET) devices are formed by a series of steps. For example, masking layers (e.g., photolithographic masks) may be used to form patterns on a semiconductor substrate or wafer. Such masking layers may be used to control or define specific regions where material is to be etched or removed, as well as to control or define specific regions where material is to be formed (e.g., through deposition, growth, etc.). In some cases, materials may be blanket deposited, followed by patterning of one or more masking layers to remove previously deposited materials in some areas while leaving the previously deposited material in other areas.

In BEOL processing, fabrication of an integrated circuit continues by forming interconnects through one or more layers of wiring and dielectric passivation layers over active devices in a FEOL region formed during the FEOL processing. Interconnections or interconnects may include metallic structures that are formed in multiple levels of interlayer dielectric (ILD) layers for electrically connecting the various devices in the FEOL region. Following FEOL and BEOL processing, a wafer may be separated or divided into multiple integrated circuit chips by dicing or other suitable techniques. In some cases, BEOL regions may be formed on both sides (e.g., "front" and "back" sides) of a FEOL region, improving routing resources.

An integrated circuit chip may include an active device region (e.g., a FEOL region with various active devices), along with a first BEOL region on a back side of the active device region and a second BEOL region on a front side of the active device region. The first BEOL region may include metal layers for power delivery from the back side of the wafer providing a back side power delivery network (BSPDN), with the first BEOL region being on a package side of the chip. The second BEOL region may be on a front side of the active device region, and may include metal layers for signal routing from the front side of the wafer. In some cases, a heat sink is attached to the second BEOL region for cooling of the chip. Although in some cases the first BEOL region is used for power delivery while the second BEOL region is used for signal routing, it should be appreciated that in other embodiments this may vary, including where one or both of the first and second BEOL regions include metal layers for both power and signal routing.

In some embodiments, a process flow includes building a die with a first (e.g., "back side") BEOL region including a BSPDN structure. A FEOL region with active devices is formed over the first BEOL region, followed by a second BEOL region over the FEOL region. The die is built with an extended dicing boundary (e.g., in a crack stop region), which permits formation of a thermal routing structure around the perimeter of the chip. The extended dicing boundary increases the perimeter of the chip by some designated amount (e.g., from X-Y to X'-Y') to create "chimneys" of a thermally conducting material such as copper (Cu) for heat dissipation. The structure may have stacked thermally conducting vias along the edges of the first and second BEOL regions as well as the FEOL region, which do not interfere with the design of the active devices of the primary chip. In some cases, bars of thermally conducting material are also formed. Thermally conducting features (e.g., thermally conducting vias, through-silicon vias (TSVs), and other features) may also be formed within the die area where the active devices are formed for local heat removal. Such thermally conducting features may be formed through the second BEOL region for local heat removal to a "top" of the structure. Such thermally conducting features may also or alternatively be formed through the first BEOL region for local heat removal to a "bottom" of the structure.

In some embodiments, an integrated circuit chip includes a diced die with a thermally conducting material formed around at least a portion of the perimeter of the diced die.

The width of the perimeter of the thermally conducting material may have a thickness of 100 micrometers (μm) or more. The thermally conducting material may contain a Cu content (e.g., a concentration or loading) of 80% or more. The thermally conducting material may include thermally conducting features (e.g., formed of Cu) in the form of vias, TSV vias, via bars, etc. Thermally conducting features may also be formed within the die area, to enable heat extraction to the top and/or bottom of the die.

The structures described herein advantageously place an additional thermal conducting region between active devices (e.g., transistors) and a cooling path. The additional thermal conducting region may be in the form of a perimeter of thermally conducting material surrounding the die of an integrated circuit chip, as well as thermally conducting features that are formed within the die area (e.g., via, bars, etc.). Thermal modeling demonstrates that a perimeter of thermally conducting material (e.g., a Cu-loaded material) surrounding the die of an integrated circuit chip can provide significant reduction in the overall maximum temperature of the integrated circuit chip (e.g., such as reducing the maximum die temperature by one degree Celsius (° C.) or greater). Thermal modeling further demonstrates that thermally conducting features within the die (e.g., vias, TSVs, bars, etc.) can reduce the maximum die temperature even further. The structures described herein thus provide significant value for various integrated circuit chips, where even a single degree temperature change is considered impactful.

Figure 1B:
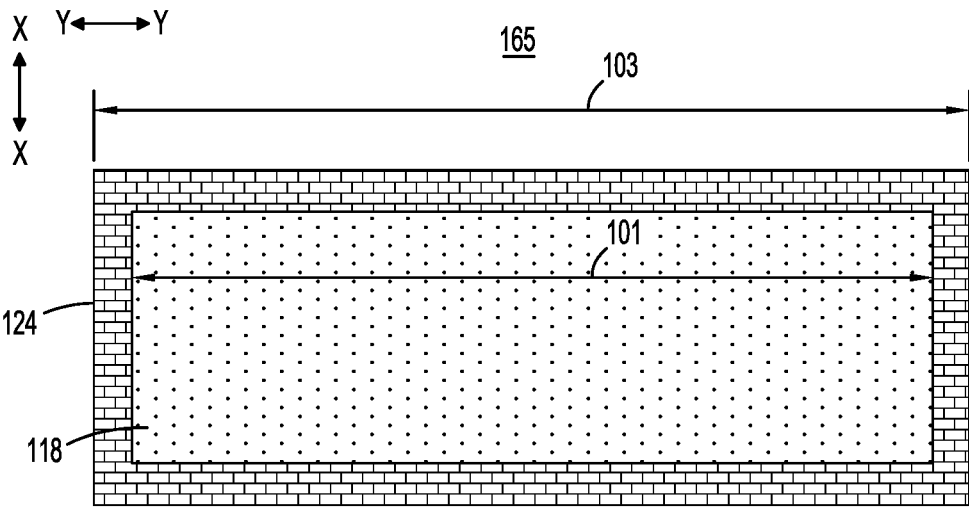

FIGS. 1A and 1B show respective views 100 and 165 of a structure with a perimeter of a thermally conducting region 124 surrounding a diced die including a first BEOL region 101, a FEOL region 103, and a second BEOL region 105. FIG. 1A shows a cross-sectional view 100 of the structure, while FIG. 1B shows a top-down view 165 of the structure taken along the line B-B shown in FIG. 1A.

The structure of FIGS. 1A and 1B includes a packaging substrate 102 (e.g., a laminate) with solder bumps 104 connecting the packaging substrate 102 to the first BEOL region 101. Here, the first BEOL region 101 includes an interlayer dielectric (ILD) layer 106 with various metal line features 108 formed therein, where the metal line features 108 include BEOL wiring which may be used for a BSPDN structure. The first BEOL region 101 may have a thickness in the range of 1 to 10 μm. The first BEOL region 101 connects to the FEOL region 103, where the FEOL region 103 includes semiconductor layer 110 (e.g., formed of silicon (Si) or another suitable semiconductor material) in which active devices 112 are formed. The FEOL region 103 also includes vias 114 and 116. The vias 114 interconnect the active devices 112 of the FEOL region 103 with the BSPDN of the first BEOL region 101. The vias 116 interconnect the active devices 112 of the FEOL region 103 with signal routing in the second BEOL region 105. The second BEOL region 105, formed over the FEOL region 103, includes an ILD layer 118 with various metal line features 120 formed therein. The metal line features 120 include BEOL wiring which may be used for signal routing in the structure. A heat sink 122 is formed over the second BEOL region 105.

The thermally conducting region 124 surrounds the diced die, providing for enhanced thermal conduction for cooling of the structure, as the ILD layers 106 and 118 are relatively poor thermal conductors. For example, the ILD layers 106 and 118 may be formed of dielectric materials such as silicon oxide (SiO), hydrogenated silicon carbon oxide (SiCOH), SiCH, SiCNH, or other types of silicon based low-k dielectrics (e.g., k less than about 4.0), porous dielectrics, or ULK (ultra-low-k) dielectric materials (with k less than about 2.5).

Figure 1C:
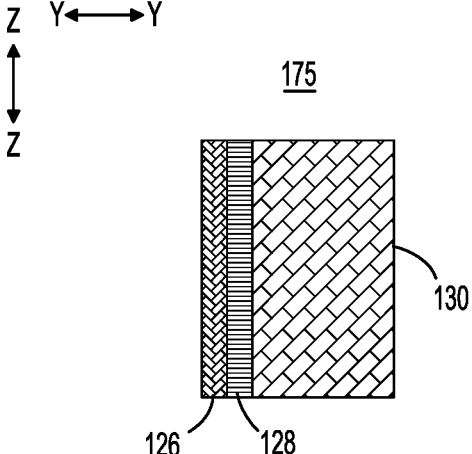

FIG. 1C shows a close-up view 175 of a portion of the thermally conducting region 124, which includes an oxide layer 126, a diffusion barrier layer 128, and a thermally conducting material 130. The oxide layer 126 may have a thickness in the range of 0.1 to 1 μm. The diffusion barrier layer 128 may be formed of tantalum (Ta), tantalum nitride (TaN) or another suitable material, and may have a thickness in the range of 0.1 to 1 μm. The thermally conducting material 130 may be formed of Cu or another suitable material, and may have a thickness which varies as needed to achieve a desired target maximum chip temperature as described in further detail below. It should be noted that the oxide layer 126, in some cases, is optional for at least portions of the structure. For example, the oxide layer 126 may be needed in the FEOL region 103 to prevent shorting of the active devices 112. The oxide layer 126 may not be needed in the first BEOL region 101 and the second BEOL region 105. The oxide layer 126, the diffusion barrier layer 128 and the thermally conducting material 130 may be formed using various deposition processes. Vias may initially be formed in the FEOL region 103 and the second BEOL region 105, followed by deposition of the oxide layer 126 (e.g., at least in the FEOL region 103 where semiconductor layer 110 is present, and optionally in vias formed within the second BEOL region 105). The diffusion barrier layer 128 and a portion of the thermally conducting material 130 may then be deposited using PVD, followed by electrochemical deposition (ECD) plating of additional thermally conducting material 130. Chemical mechanical polishing (CMP) may then be performed to level the surface.

In some embodiments, the thermally conducting region 124 is formed inside a crack stop region of the structure before it is diced to form the die shown in FIGS. 1A and 1B. The crack stop region includes a metal material which is used to prevent cracking while dicing a wafer to form diced die. The thermally conducting region 124 may be an area with a high loading of a thermally conducting material such as Cu. In some embodiments, the thermally conducting region 124 includes a Cu content of 80% or more. The width x of the thermally conducting region 124 may be 100 to 1000 μm or more, which increases the overall chip size by 2x in each direction. For example, the width 101 may be y, with the width 103 being y+2x. The thermally conducting region 124 increases the overall perimeter of the diced die by a small amount to create "chimneys" of the thermally conducting material (e.g., Cu) for heat dissipation. The thermally conducting region 124 may include stacked vias and bars along the edges of the die which do not interfere with the design of the primary chip (e.g., active devices 112, such as transistors and other logic devices that are within the FEOL region 103).

While the thermally conducting region 124 is shown in FIG. 1B as completely surrounding a perimeter of the diced die, it should be appreciated that in other embodiments the thermally conducting region 124 may only partially surround the perimeter of the diced die (e.g., it may be formed surrounding less than all four sides of the diced die, on portions but not the entirety of each of the four sides of the diced die, etc.).

Figure 2A:
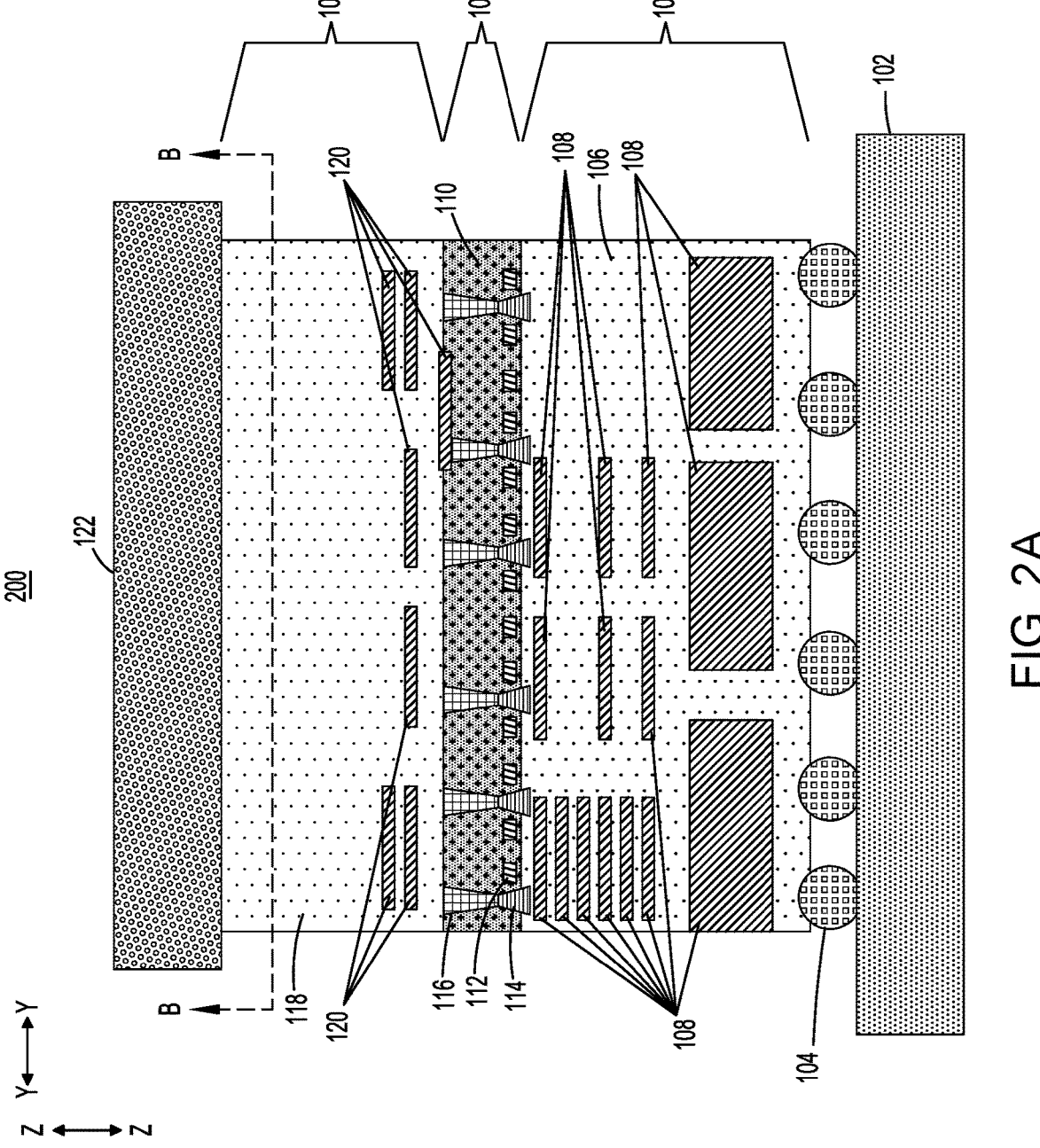
FIGS. 2A and 2B show views of a structure without a perimeter of thermally conducting material surrounding the die, according to an embodiment of the invention.
Figures 2B, 3:
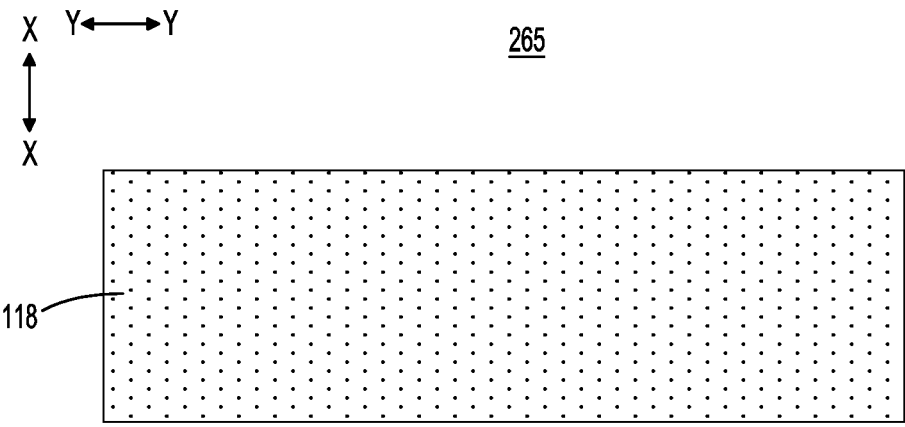
FIG. 3 shows a table characterizing reduction in maximum chip temperature as a function of a width of a perimeter of thermally conducting material surrounding a die, according to an embodiment of the invention.

Thermal modeling demonstrates the amount of heat dissipation which can occur within the thermally conducting region 124, and thus how much effective temperature reduction is created. Here, is it assumed that the thermally conducting region 124 includes Cu-rich regions with a Cu loading of 80% (e.g., which may be the maximum allowed per ground design rules). For thermal modeling, heat is set at the bottom surface of the first BEOL region 101, and a heat transfer coefficient of 20000 Watts per square meter Kelvin (W/m²K) is set at the top surface (e.g., which may be achieved through water cooling or some other type of heatsink). This is compared with a conventional structure such as that shown in FIGS. 2A and 2B. FIGS. 2A and 2B show a side cross-sectional view 200 and a top-down view 265 of a structure which is similar to that of the structure of FIGS. 1A and 1B, except that the structure of FIGS. 2A and 2B does not include the thermally conducting region 124. Thus, there is a smaller heat transfer area in the structure of FIGS. 2A and 2B as the overall perimeter is smaller since the thermally conducting region 124 is not present.

For simulation, a 10000 μm by 10000 μm square structure is considered, with a thin BEOL region of 10 μm and a thick silicon (Si) region of 775 μm. FIG. 3 shows a table 300, showing various perimeter widths of the thermally conducting region 124 and the resulting maximum chip temperature. As shown, increasing the width of the perimeter of the thermally conducting region 124 from 0 to 1000 μm results in a reduction in the maximum chip temperature of approximately one degree Celsius. It can thus be seen that, depending on the target maximum chip temperature, the perimeter width of the thermally conducting region 124 may be tuned as needed.

Figures 4A, 4B:
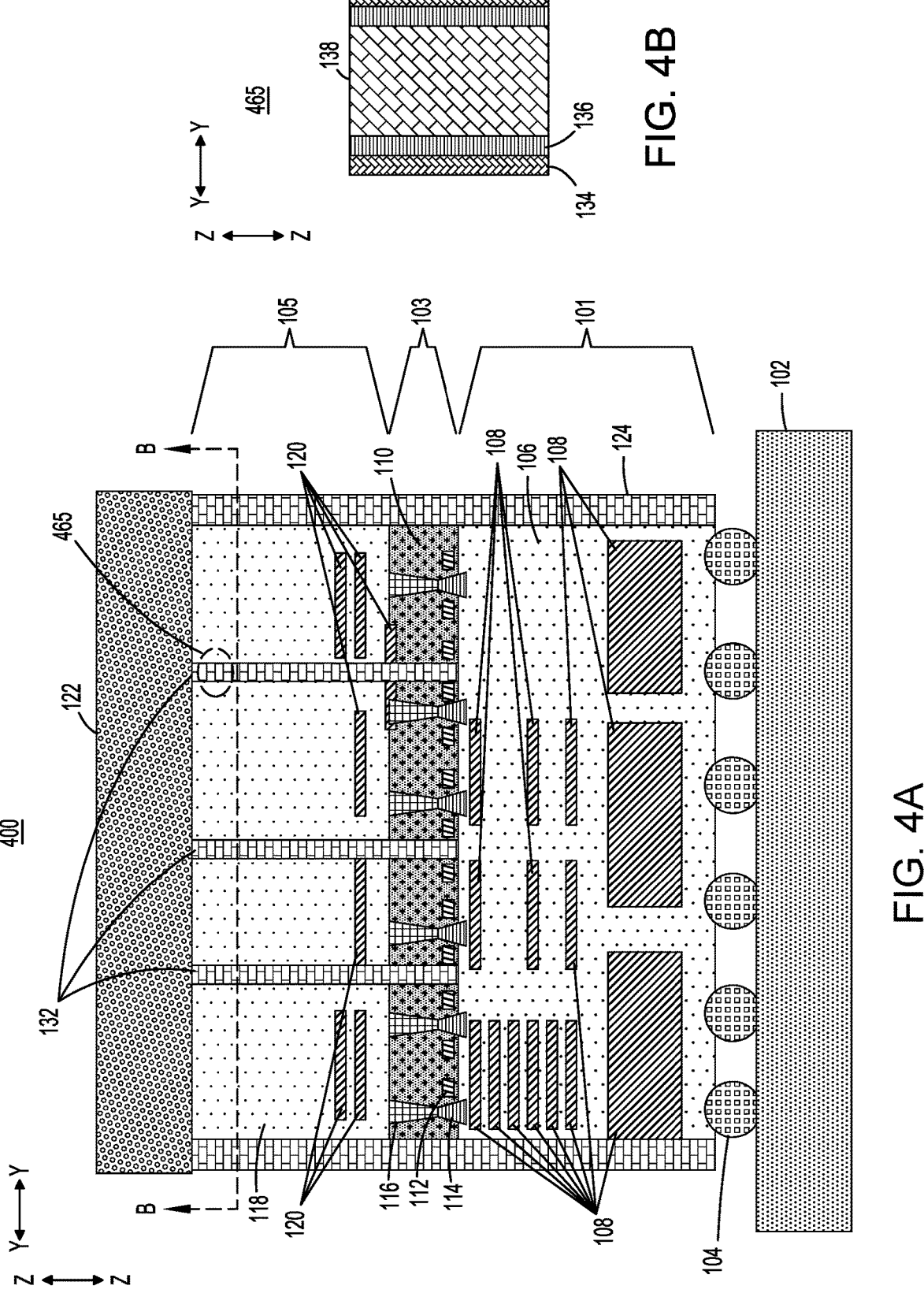
FIGS. 4A and 4B show views of a structure with a perimeter of thermally conducting material surrounding a die along with thermally conducting features within the die area extending to a top side of the structure, according to an embodiment of the invention.

Placement of thermally conducting features within the die area (e.g., near to hot spots) may further aid in heat extraction. FIG. 4A shows a cross-sectional view 400 of a structure similar to that of FIGS. 1A-1C including the thermally conducting region 124 surrounding the perimeter of the diced die, along with thermally conducting features 132 within the die area which extend from the FEOL region 103 through the second BEOL region 105 and the heat sink 122 on the top of the structure. The thermally conducting features 132 thermally couple the FEOL region 103 to the heat sink 122. The thermally conducting features 132 may include TSVs or Cu vias which aid in heat extraction. Each of the thermally conducting features 132 may have a width (in direction Y) in the range of 100 μm to 2 millimeters (mm). FIG. 4B shows a close-up view 465 of one of the thermally conducting features 132 which, similar to the thermally conducting region 124, includes an optional oxide layer 134, a diffusion barrier layer 136 and thermally conducting material 138. The oxide layer 134, the diffusion barrier layer 136 and the thermally conducting material 138 may be formed using similar processing, and with similar materials and sizing as that described above with respect to the oxide layer 126, the diffusion barrier layer 128 and the thermally conducting material 130.

Figures 5A, 5B:
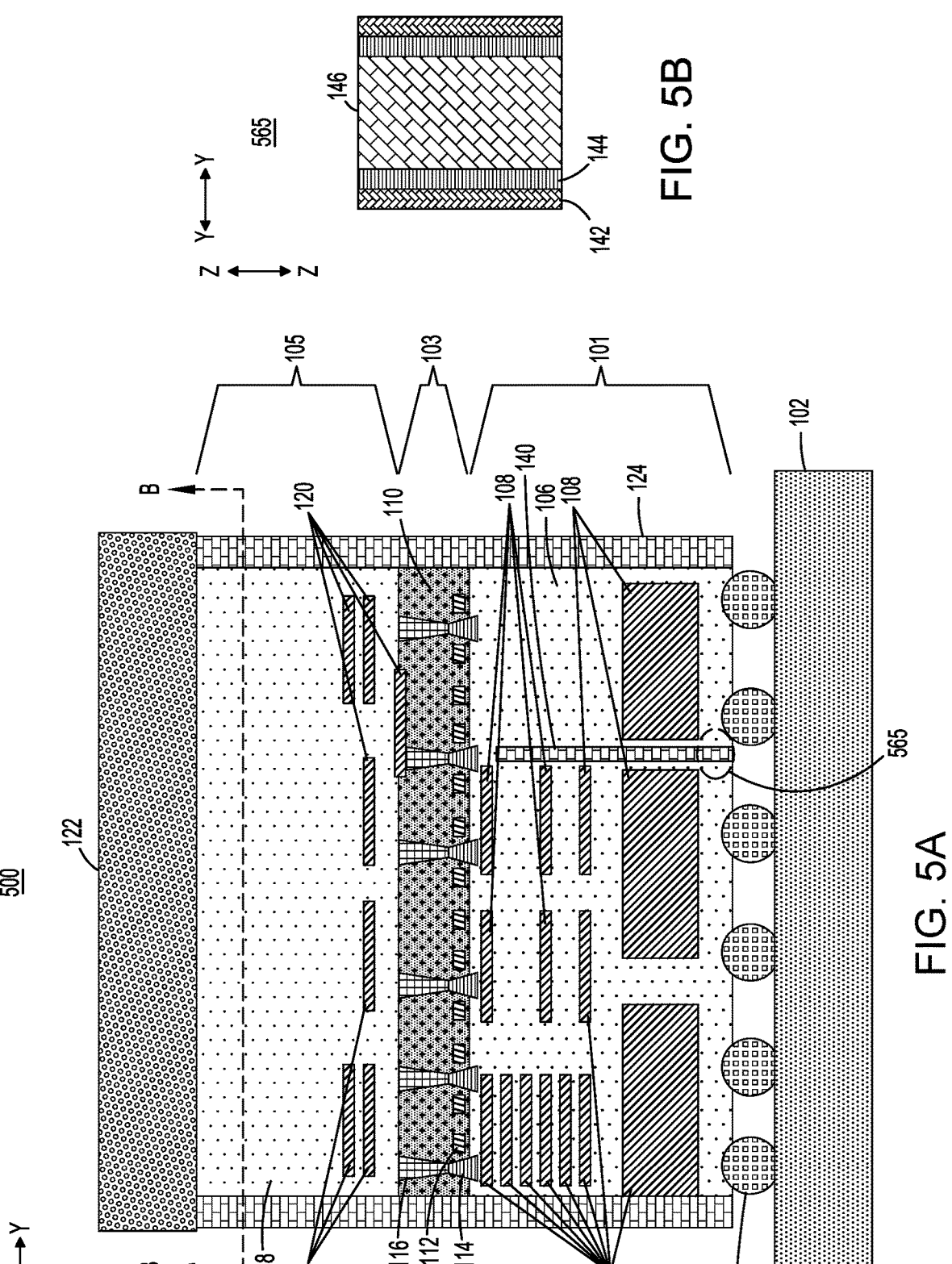
FIGS. 5A and 5B show views of a structure with a perimeter of thermally conducting material surrounding a die along with thermally conducting features within the die area extending to a bottom side of the structure, according to an embodiment of the invention.

FIG. 5A shows a cross-sectional view 500 of a structure similar to that of FIGS. 1A-1C including the thermally conducting region 124 surrounding the perimeter of the diced die, along with a thermally conducting feature 140 within the die area which extends in the first BEOL region 101 to the bottom of the structure. The thermally conducting feature 140 may include a TSV or Cu via which aids in heat extraction. The thermally conducting feature 140 may have a width (in direction Y) in the range of 100 to 500 μm. FIG. 5B shows a close-up view 565 of the thermally conducting feature 140 which, similar to the thermally conducting region 124, includes an optional oxide layer 142, a diffusion barrier layer 144 and thermally conducting material 146. The oxide layer 142, the diffusion barrier layer 144 and the thermally conducting material 146 may be formed using similar processing, and with similar materials and sizing as that described above with respect to the oxide layer 126, the diffusion barrier layer 128 and the thermally conducting material 130.

Figure 6:
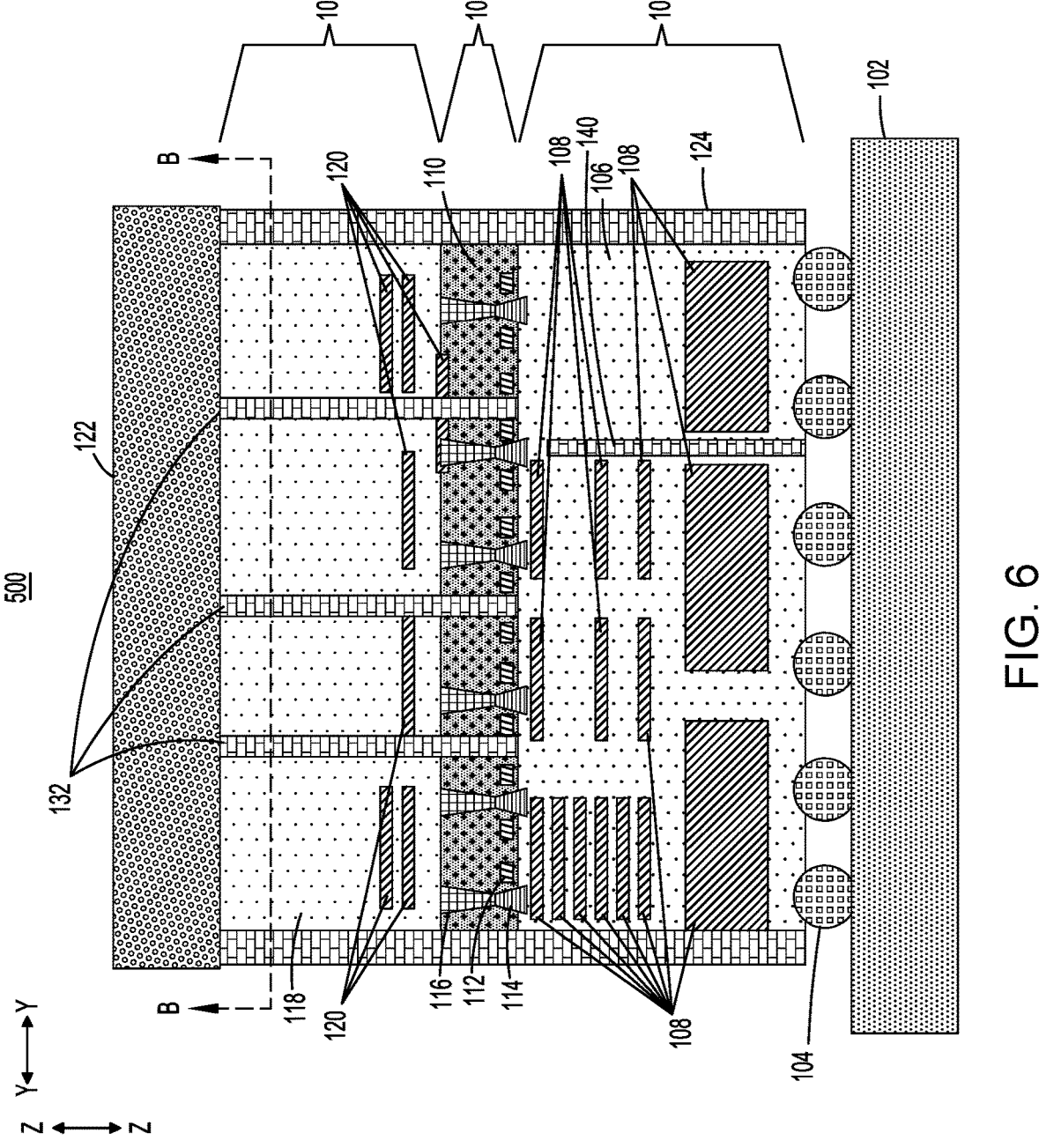
FIG. 6 shows a view of a structure with a perimeter of thermally conducting material surrounding a die along with thermally conducting features within the die area extending to top and bottom sides of the structure, according to an embodiment of the invention.
Figures 7, 8:
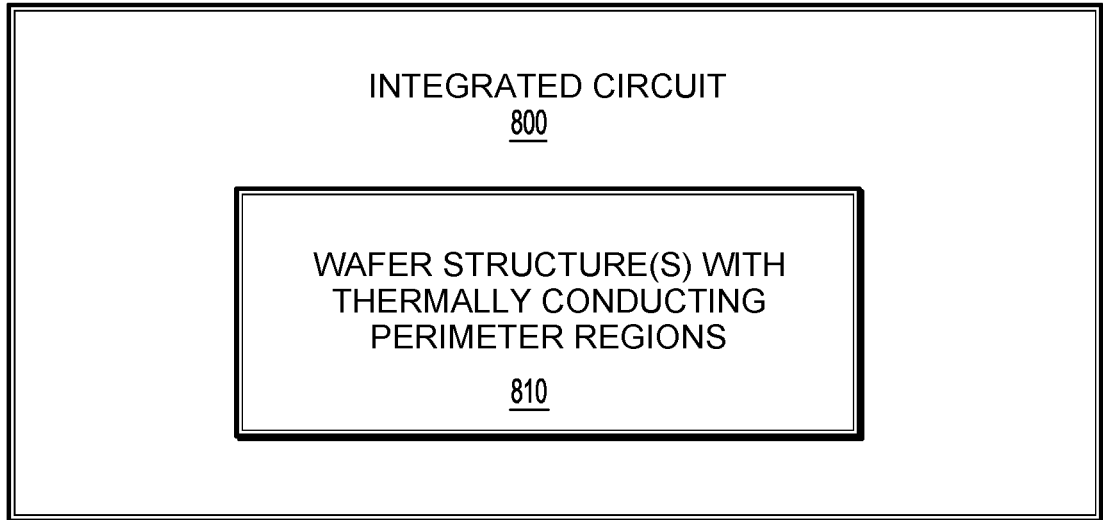
FIG. 7 shows a table characterizing reduction in maximum chip temperature as a function of a number of thermally conducting features within the die area of a structure, according to an embodiment of the invention.
FIG. 8 depicts an integrated circuit including a die with a thermally conducting perimeter region, according to an embodiment of the invention.

FIG. 6 shows a cross-sectional view 600 of a structure similar to that of FIGS. 1A-1C including the thermally conducting region 124 surrounding the perimeter of the diced die, along with the thermally conducting features 132 described above with respect to FIGS. 4A and 4B and the thermally conducting feature 140 described above with respect to FIGS. 5A and 5B. It should be appreciated that the particular numbers and locations of the thermally conducting features 132 and 140 may vary as desired based on the available spacing within the structure and the amount of reduction of the maximum chip temperature which is desired. FIG. 7 shows a table 700 showing the calculated maximum chip temperature for different numbers of thermally conducting via features.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 8 shows an example integrated circuit 800 which includes one or more wafer die structures with thermally conducting perimeter regions 810.

In some embodiments, a semiconductor structure includes a FEOL region, a first BEOL region coupled to a first side of the FEOL-region, a second BEOL region coupled to a second side of the FEOL-region, and a thermally conducting region at least partially surrounding a perimeter of the FEOL region, the first BEOL region and the second BEOL region.

The first BEOL region may provide signal routing for one or more active devices in the FEOL region, and the second BEOL region may provide a power delivery structure for the one or more active devices in the FEOL region.

The first BEOL region may be coupled to a heat sink, and the second BEOL region may be coupled to a packaging substrate.

The thermally conducting region may include a thermally conducting material and a diffusion barrier layer between (i) the thermally conducting material and (ii) the FEOL region, the first BEOL region and the second BEOL region. The thermally conducting region may further include an oxide layer between the thermally conducting material and the FEOL region. The thermally conducting region may further include an oxide layer between (i) the thermally conducting material and (ii) the FEOL region, the first BEOL region and the second BEOL region.

The thermally conducting region may include a copper material.

The thermally conducting region may include a thermally conducting material with a copper content of 80% or more.

The semiconductor structure may further include one or more thermally conducting features positioned within the FEOL region and extending through the second BEOL region.

The semiconductor structure may further include one or more thermally conducting features positioned within at least a portion of the first BEOL region.

The semiconductor structure may further include a first set of one or more thermally conducting features positioned within at least a portion of the first BEOL region, and a second set of one or more thermally conducting features positioned within at least a portion of the second BEOL region.

In some embodiments, a semiconductor structure includes a wafer die including one or more active devices in a FEOL region and a BEOL region coupled to one side of the FEOL region, and a thermally conducting region at least partially surrounding a perimeter of the wafer die.

The semiconductor structure may further include another BEOL region coupled to another side of the FEOL region. The BEOL region provides signal routing for one or more active devices in the FEOL region. The other BEOL region provides a power delivery structure for the one or more active devices in the FEOL region.

The semiconductor structure may further include one or more thermally conducting features positioned within at least a portion of the BEOL region.

The thermally conducting region may include a thermally conducting material with a copper content of 80% or more.

In some embodiments, an integrated circuit includes a wafer die structure and a thermally conducting region at least partially surrounding a perimeter of the wafer die structure. The wafer die structure includes one or more active devices in a FEOL region, a first BEOL region coupled to a first side of the FEOL region, and a second BEOL region coupled to a second side of the FEOL region.

The first BEOL region may provide signal routing for one or more active devices in the FEOL region, and the second BEOL region may provide a power delivery structure for the one or more active devices in the FEOL region.

The first BEOL region may be coupled to a heat sink, and the second BEOL region may be coupled to a packaging substrate.

The wafer die structure may further include a first set of one or more thermally conducting features positioned within at least a portion of the first BEOL region, and a second set of one or more thermally conducting features positioned within at least a portion of the second BEOL region.

The thermally conducting region may include a thermally conducting material with a copper content of 80% or more.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first back-end-of-line region having a top surface and a bottom surface, the bottom surface of the first back-end-of-line region being coupled to a top surface of a front-end-of-line region;
a second back-end-of-line region having a top surface and a bottom surface, a top surface of the second back-end-of-line region being coupled to a bottom surface of the front-end-of-line region;

wherein the first back-end-of-line region has a first set of sidewalls extending from the top surface of the first back-end-of-line region to the bottom surface of the first back-end-of-line region;
wherein the front-end-of-line region has a second set of sidewalls extending from the top surface of the front-end-of-line region to the bottom surface of the front-end-of-line region;
wherein the second back-end-of-line region has a third set of sidewalls extending from the top surface of the second back-end-of-line region to the bottom surface of the second back-end-of-line region;
wherein the first set of sidewalls, the second set of sidewalls and the third set of sidewalls define a common outer perimeter of the front-end-of-line region, the first back-end-of-line region and the second back-end-of-line region; and
a thermally conducting region disposed on:
(i) at least a portion of the first set of sidewalls of the first back-end-of line region;
(ii) at least a portion of the second set of sidewalls of the front-end-of-line region; and
(iii) at least a portion of the third set of sidewalls of the second back-end-of-line region.

2. A semiconductor structure comprising:
a first back-end-of-line region coupled to a first side of a front-end-of-line region;
a second back-end-of-line region coupled to a second side of the front-end-of-line region;
a thermally conducting region at least partially surrounding a perimeter of the front-end-of-line region, the first back-end-of-line region and the second back-end-of-line region;
wherein the thermally conducting region comprises a thermally conducting material and a diffusion barrier layer, wherein the diffusion barrier layer separates the thermally conducting material from the front-end-of-line region, the first back-end-of-line region and the second back-end-of-line region.

3. The semiconductor structure of claim 2, wherein the thermally conducting region further comprises an oxide layer between the thermally conducting material and the front-end-of-line region.

4. The semiconductor structure of claim 2, wherein the thermally conducting region further comprises an oxide layer between (i) the thermally conducting material and (ii) the front-end-of-line region, the first back-end-of-line region and the second back-end-of-line region.

5. The semiconductor structure of claim 2, wherein the thermally conducting region comprises a copper material.

6. The semiconductor structure of claim 2, wherein the thermally conducting region comprises a thermally conducting material with a copper content of 80% or more.

7. The semiconductor structure of claim 2, further comprising one or more thermally conducting features positioned within the front-end-of-line region and extending through the second back-end-of-line region.

8. The semiconductor structure of claim 2, further comprising one or more thermally conducting features positioned within at least a portion of the first back-end-of-line region.

9. The semiconductor structure of claim 2, further comprising:
a first set of one or more thermally conducting features positioned within at least a portion of the first back-end-of-line region; and a second set of one or more thermally conducting features positioned within at least a portion of the second back-end-of-line region.

10. The semiconductor structure of claim 1, wherein the first back-end-of-line region provides signal routing for one or more active devices in the front-end-of-line region, and wherein the second back-end-of-line region provides a power delivery structure for the one or more active devices in the front-end-of-line region.

11. The semiconductor structure of claim 1, wherein the first back-end-of-line region is coupled to a heat sink, and wherein the second back-end-of-line region is coupled to a packaging substrate.

12. The semiconductor structure of claim 1, wherein the thermally conducting region comprises a copper material.

13. The semiconductor structure of claim 1, wherein the thermally conducting region comprises a thermally conducting material with a copper content of 80% or more.

14. The semiconductor structure of claim 1, further comprising one or more thermally conducting features positioned within the front-end-of-line region and extending through the second back-end-of-line region.

15. The semiconductor structure of claim 1, further comprising one or more thermally conducting features positioned within at least a portion of the first back-end-of-line region.

16. The semiconductor structure of claim 1, further comprising:

a first set of one or more thermally conducting features positioned within at least a portion of the first back-end-of-line region; and a second set of one or more thermally conducting features positioned within at least a portion of the second back-end-of-line region.

17. The semiconductor structure of claim 2, wherein the first back-end-of-line region provides signal routing for one or more active devices in the front-end-of-line region, and wherein the second back-end-of-line region provides a power delivery structure for the one or more active devices in the front-end-of-line region.

18. The semiconductor structure of claim 2, wherein the first back-end-of-line region is coupled to a heat sink, and wherein the second back-end-of-line region is coupled to a packaging substrate.

* * * * *